US012777795B2

(12) United States Patent
Takahashi et al.

(10) Patent No.: US 12,777,795 B2
(45) Date of Patent: Oct. 27, 2026

(54) DISPLAY DEVICE INCLUDING CURVED SHAPE PLANARIZATION LAYER OUTER EDGE

(71) Applicant: Magnolia White Corporation, Tokyo (JP)

(72) Inventors: Hideyuki Takahashi, Tokyo (JP); Kazuyuki Harada, Tokyo (JP); Hiroshi Tabatake, Tokyo (JP); Masato Nakamura, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 423 days.

(21) Appl. No.: 18/461,541

(22) Filed: Sep. 6, 2023

(65) Prior Publication Data

US 2024/0081114 A1 Mar. 7, 2024

(30) Foreign Application Priority Data

Sep. 7, 2022 (JP) ................................. 2022-142145

(51) Int. Cl.
*H10K 59/13* (2023.01)
*H10K 59/131* (2023.01)
(Continued)

(52) U.S. Cl.
CPC ........... *H10K 59/131* (2023.02); *H10K 59/40* (2023.02); *H10K 59/871* (2023.02); *H10K 50/844* (2023.02); *H10K 2102/351* (2023.02)

(58) Field of Classification Search
CPC .... H10K 59/131; H10K 59/40; H10K 59/971; H10K 59/873; H10K 59/12; H10K 59/124; H10K 50/844
See application file for complete search history.

(56) References Cited

U.S. PATENT DOCUMENTS 10,886,339 B2 * 1/2021 Won ....................... G06F 3/0443
11,114,510 B2 * 9/2021 Gwon ................... G06F 3/0412
(Continued)

FOREIGN PATENT DOCUMENTS

CN 109213364 B * 9/2021 ........... H10K 59/131
CN 114690949 A * 7/2022 ........... G06F 3/0412
(Continued)

OTHER PUBLICATIONS

English machine translation of Office Action dated Sep. 1, 2026 issued in JP Appl. No. 2022-142145, 4pp.

*Primary Examiner* — Ida M Soward
(74) *Attorney, Agent, or Firm* — XSENSUS LLP

(57) ABSTRACT

A display device includes a planarization layer on a substrate, a pixel with an organic electroluminescence element on the planarization layer, a sealing layer covering the pixel, a terminal electrode arranged at an edge of the substrate, and a first wiring arranged over the sealing layer and electrically connected to the terminal electrode. The planarization layer has an outer edge that forms a step over the substrate between the pixel and the terminal electrode. The first wiring extends from above the sealing layer to intersect with the step. In a plan view, the step has a first protrusion of the planarization layer protruding in a direction of the terminal electrode, a second protrusion adjacent to the first protrusion and protruding in a direction of the terminal electrode, and an intermediate region between the first protrusion and the second protrusion.

20 Claims, 20 Drawing Sheets

(51) Int. Cl.

| | |
|---|---|
| ***H10K 59/40*** | (2023.01) |
| ***H10K 59/80*** | (2023.01) |
| *H10K 50/844* | (2023.01) |
| *H10K 102/00* | (2023.01) |

(56) References Cited

U.S. PATENT DOCUMENTS

| | | | | |
|---|---|---|---|---|
| 11,269,446 | B2 * | 3/2022 | Lee | G06F 3/0412 |
| 11,342,406 | B2 * | 5/2022 | Managaki | G06F 3/04164 |
| 2017/0262109 | A1 * | 9/2017 | Choi | H10D 86/411 |
| 2018/0061898 | A1 * | 3/2018 | Oh | G06F 3/0443 |
| 2019/0164995 | A1 * | 5/2019 | Lee | H10D 86/411 |
| 2020/0235169 | A1 | 7/2020 | Miyamoto et al. | |
| 2021/0366998 | A1 * | 11/2021 | Kim | H10K 59/131 |
| 2022/0271097 | A1 * | 8/2022 | Kim | H10K 59/40 |
| 2023/0200113 | A1 * | 6/2023 | Jeong | H10K 71/00<br>257/40 |

FOREIGN PATENT DOCUMENTS

| | | | | | |
|---|---|---|---|---|---|
| JP | 2019050136 | A | | 3/2019 | |
| JP | 2019-074709 | A | | 5/2019 | |
| KR | 20190048784 | A | * | 5/2019 | G06F 3/0412 |
| TW | 202105151 | A | * | 2/2021 | G06F 3/0448 |
| WO | 2020021654 | A1 | | 1/2020 | |

* cited by examiner

DISPLAY DEVICE INCLUDING CURVED SHAPE PLANARIZATION LAYER OUTER EDGE

CROSS-REFERENCE TO RELATED APPLICATION

This application claims the benefit of priority to Japanese Patent Application No. 2022-142145 filed on Sep. 7, 2022, the entire contents of which are incorporated herein by reference.

FIELD

An embodiment of the present invention relates to a display device.

BACKGROUND

A display device using an on-cell type touch sensor is known as one display device in which flexible printed substrates are bonded together (see Japanese laid-open patent publication No. 2019-74709). An electrode used for a touch sensor is formed on a sealing layer of the touch sensor, and a wiring for transmitting a signal from an electrode to the flexible printed substrate is formed on the display device.

A wiring for transmitting a signal from an electrode used for a touch sensor to a flexible printed substrate may be short-circuited due to film residue of the wiring due to poor wiring patterning when it gets over a step portion of the planarization layer arranged between the pixel and the flexible printed substrate. A wedge-shaped protrusion was arranged in the step portion as a countermeasure against the short circuit.

However, in the case where the wedge-shaped protrusion is arranged in the step portion, the inclination of the step portion becomes steep at a root portion of the step portion, and the step portion may be exposed from a sealing layer, particularly an inorganic sealing layer, which is arranged so as to cover the step portion as a starting point.

SUMMARY

An embodiment of the present invention is a display device. The display device includes a planarization layer on a substrate, a pixel with an organic electroluminescence element on the planarization layer, a sealing layer covering the pixel, a terminal electrode arranged at an edge of the substrate, and a first wiring arranged over the sealing layer and electrically connected to the terminal electrode. The planarization layer has an outer edge that forms a step over the substrate between the pixel and the terminal electrode. The first wiring extends from above the sealing layer to intersect with the step. In a plan view, the step has a first protrusion of the planarization layer protruding in a direction of the terminal electrode, a second protrusion adjacent to the first protrusion and protruding in a direction of the terminal electrode, and an intermediate region between the first protrusion and the second protrusion. The outer edge of the planarization layer has a curved shape in a plan view from the first protrusion to the intermediate region and from the second protrusion to the intermediate region. The first wiring intersects the intermediate region and extends in the direction of the terminal electrode.

DESCRIPTION OF EMBODIMENTS

Figure 1:
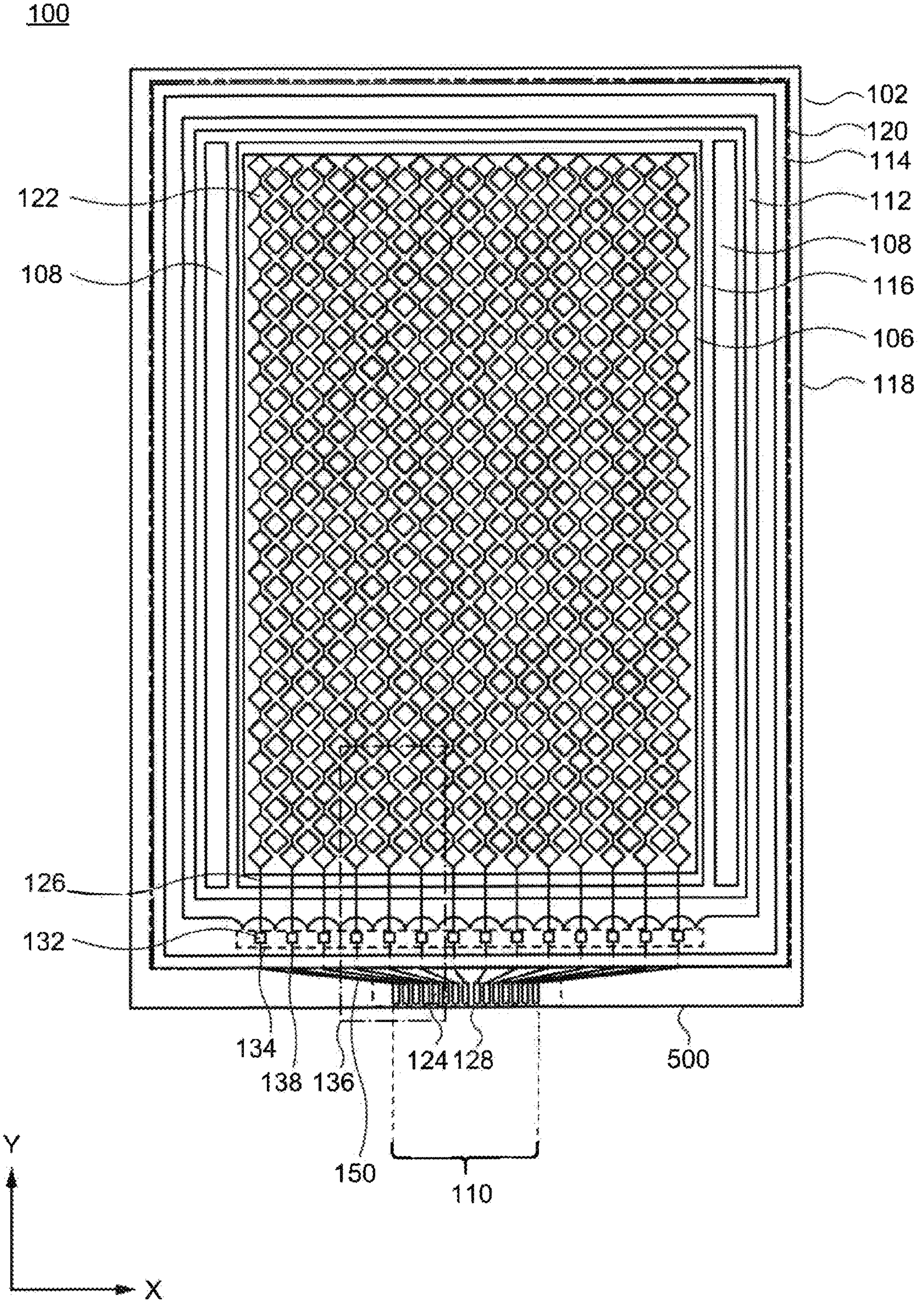
FIG. 1 is a schematic top view of a display device according to an embodiment of the present invention.

Hereinafter, embodiments of the present invention will be described with reference to the drawings and the like. However, the present invention can be implemented in various aspects without departing from the gist thereof, and is not to be construed as being limited to the description of the embodiments exemplified below.

In the drawings, the widths, thicknesses, shapes, and the like of the respective portions may be schematically represented in comparison with the actual embodiments for clarity of explanation, but the drawings are merely examples, and do not limit the interpretation of the present invention. In the present specification and the drawings, elements having the same functions as those described with respect to the above-described drawings are denoted by the same reference signs, and redundant descriptions thereof may be omitted.

In the present specification and claims, when expressing the manner of arranging another structure on a certain structure, the term “on” shall include both arranging another structure directly above a certain structure and arranging another structure over a certain structure via yet another structure, unless otherwise specified.

In the present specification and claims, the phrase “a structure is exposed from another structure” means an aspect in which part of a structure is not covered by another structure, and it includes an aspect in which the part not covered by another structure is covered by yet another structure.

In the present specification and claims, the term end view refers to a vertical cut of an object as viewed from the side. The end view shall include a diagram of an end view. In addition, the expression plan view indicates when the object is viewed from directly above. Top view or plan view shall include a diagram of a plan view.

First Embodiment

1. Overall Structure

In the present embodiment, a configuration of a display device 100 according to an embodiment will be described. FIG. 1 is a schematic top view of a display device according to an embodiment.

As shown in FIG. 1, the display device 100 has a substrate 102, and a touch sensor 106, a sensor electrode 122, a sensor wiring 126, a contact portion 134, a wiring 138, a terminal wiring 150, a mounting pad 110, a terminal electrode 124, a COF mounting region 128, a drive circuit 108, a first step 112, and a second step 114 are arranged on the substrate 102.

The display device 100 includes a display region 116 and a peripheral region 118 surrounding the display region 116. The touch sensor 106 is arranged in the display region 116, and the drive circuit 108, the mounting pad 110, the contact portion 134, the first step 112, and the second step 114 are arranged in the peripheral region 118. Although omitted in FIG. 1, the display device 100 further includes a counter substrate 120 paired with the substrate 102, as shown in dotted lines in FIG. 5, which will be described later, so as to overlap the display region 116 and the peripheral region 118.

The sensor electrode 122 is arranged in the touch sensor 106. The sensor electrode 122 is connected to the sensor wiring 126. The sensor wiring 126 is electrically connected to the wiring 138 via a contact 132 arranged in the contact portion 134. The wiring 138 is electrically connected to the terminal wiring 150. The terminal wiring 150 is connected to the terminal electrode 124 arranged in the mounting pad 110. As a result, the sensor electrode 122 is electrically connected to the terminal electrode 124.

As shown in FIG. 1, the outer shape of the substrate 102 may be rectangular or polygonal. Furthermore, the outer shape of the substrate 102 may have an arcuate portion. In this case, in the case where a plurality of display devices 100 is manufactured from one substrate, the outer shape of the display device 100 cut out from one substrate is used as the outer shape of the substrate 102.

Figure 2:
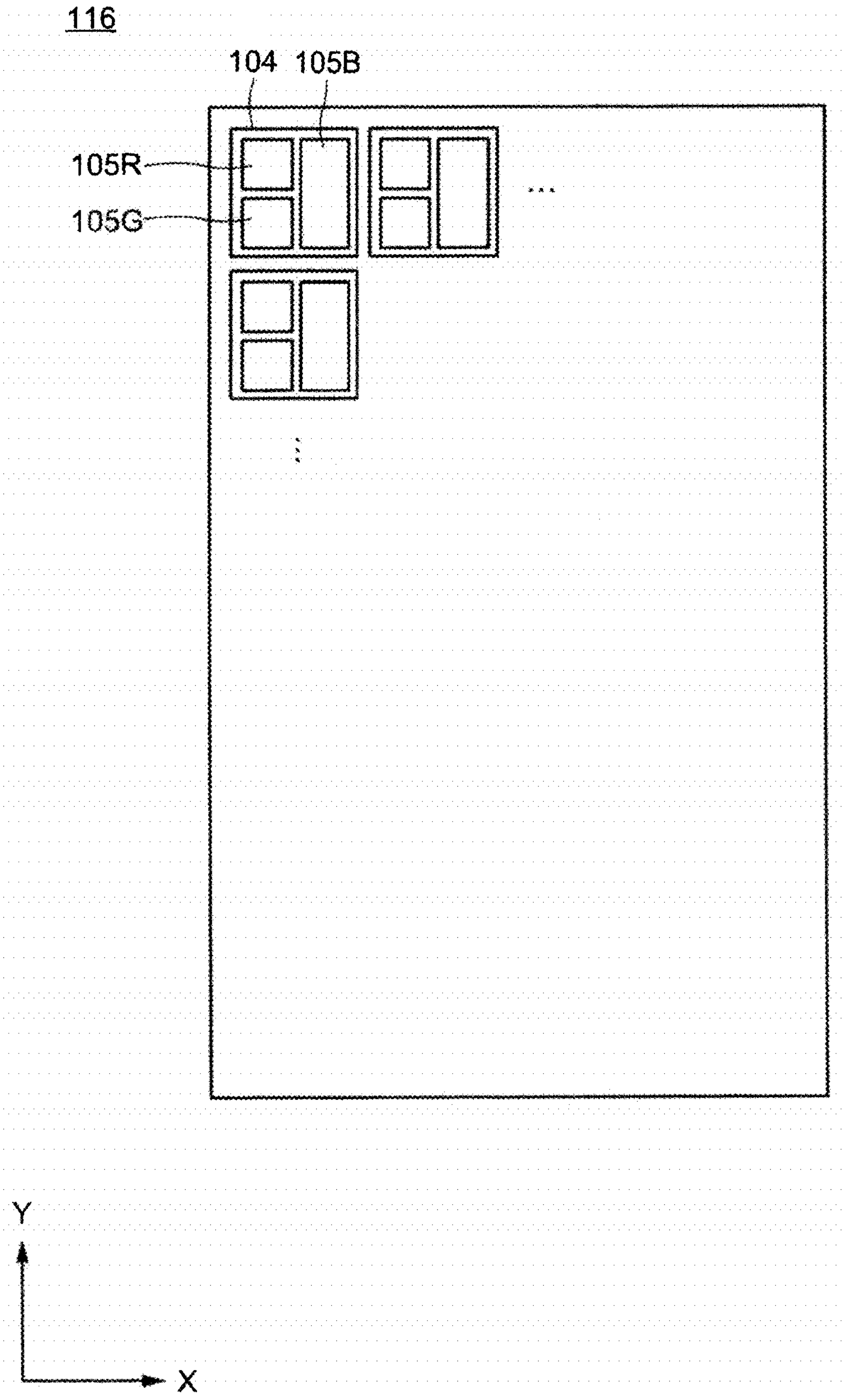
FIG. 2 is a schematic top view of a display device according to an embodiment of the present invention.

A plurality of pixels can be arranged in the display region 116. FIG. 2 shows a schematic plan view of the display region 116. FIG. 2 shows a plan view of a layer in which the plurality of pixels is arranged. As shown in FIG. 2, for example, a plurality of pixels 104 is arranged in a row direction (direction X) and a column direction (direction Y) in the display region 116. A plurality of light-emitting elements 105, for example, a light-emitting element 105R, a light-emitting element 105G, and a light-emitting element 105B is arranged in each pixel 104. The light-emitting element 105R, the light-emitting element 105G, and the light-emitting element 105B may emit light of different colors. For example, the light-emitting element 105R may emit red, the light-emitting element 105G may emit green, and the light-emitting element 105B may emit blue. For example, the light-emitting element 105 may be an organic electroluminescence (EL) element.

Figure 3:
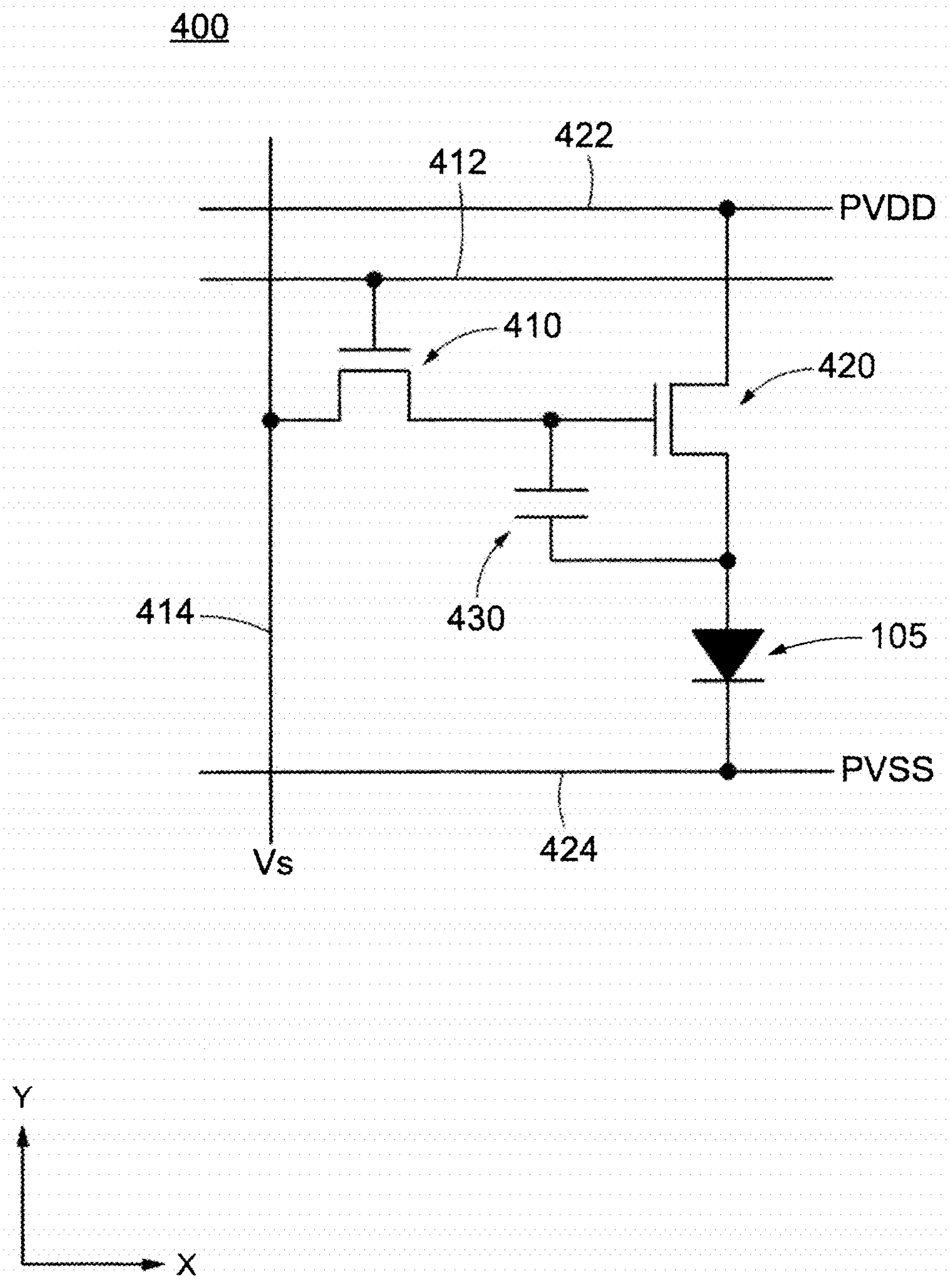
FIG. 3 shows a circuit diagram of a pixel of a display device according to an embodiment of the present invention.

The light-emitting element 105 is electrically connected to a transistor arranged in each pixel 104. FIG. 3 shows a circuit diagram showing a circuit configuration of the pixel 104. A pixel circuit 400 includes a select transistor 410, a drive transistor 420, a capacitor 430, and the light-emitting element 105.

The select transistor 410 is connected to a gate line 412 and a data line 414. Specifically, the gate line 412 is connected to a gate of the select transistor 410. The data line 414 is connected to a source of the select transistor 410. The select transistor 410 functions as a switch for selecting whether to input a data signal (video signal Vs) to the pixel circuit 400. A drain of the select transistor 410 is connected to a gate of the drive transistor 420 and the capacitor 430.

The drive transistor 420 is connected to an anode power line 422, the light-emitting element 105, and the capacitor 430. Specifically, the anode power line 422 is connected to a drain of the drive transistor 420. The light-emitting element 105 is connected to a source of the drive transistor 420. The capacitor 430 is connected between the gate and the source of the drive transistor 420. The drive transistor 420 controls a current flowing through the light-emitting element 105. A high potential power supply voltage (PVDD) is applied to the anode power line 422.

The capacitor 430 holds the data signal input through the select transistor 410. A voltage corresponding to the data signal held in the capacitor 430 is applied to the gate of the drive transistor 420. As a result, the amount of current flowing through the drive transistor 420 is controlled according to the data signal.

The light-emitting element 105 is connected between the drive transistor 420 and a cathode power line 424. Specifically, an anode of the light-emitting element 105 is connected to the source of the drive transistor 420. That is, the anode of the light-emitting element 105 is connected to the anode power line 422 via the drive transistor 420. A cathode of the light-emitting element 105 is connected to the cathode power line 424. A low potential power supply voltage (PVSS) is applied to the cathode power line 424.

In the pixel circuit 400, when the select transistor 410 is turned on, the data signal is input from the data line 414. A voltage corresponding to the input data signal is held by the capacitor 430. Thereafter, in the light emission period, the gate of the drive transistor 420 is controlled by the voltage held in the capacitor 430, and a current corresponding to the data signal flows through the drive transistor 420. A current flows through the light-emitting element 105, and then the light-emitting element 105 emits light with a brightness corresponding to the current.

The signal supplied to the pixel circuit 400 is supplied from the drive circuit 108 electrically connected to the pixel circuit 400. The drive circuit 108 may be arranged between the display region 116 and the first step 112. An example in which a plurality of drive circuits 108 is arranged so as to sandwich the display region 116 is shown in FIG. 1 but is not limited to this arrangement.

The drive circuit 108 may be electrically connected to an external drive circuit via a wiring (not shown), and may drive the pixel 104 according to a signal supplied from the external drive circuit. A driving IC (Integrated Circuit) can be used as the external drive circuit. The driving IC can supply the signal to the drive circuit 108 via the mounting pad 110.

For example, the driving IC may be mounted on the substrate 102 by COF (Chip On Film) using an anisotropic conductive film (ACF: Anisotropic Conductive Film). In this case, for example, an FOG (Film On Glass) on which a wiring substrate is mounted using the anisotropic conductive film can be used as the terminal electrode 124 of the mounting pad 110. In the case where COF is installed on the mounting pad 110 using FOG, COF is installed by thermo-compression bonding with the mounting pad 110 in the COF mounting region 128 including the mounting pad 110 shown in FIG. 1.

The sensor electrode 122 is arranged in the touch sensor 106. The sensor electrode 122 is connected to the sensor wiring 126. The sensor wiring 126 is electrically connected to the wiring 138 via the contact 132 arranged in the contact portion 134. The wiring 138 is electrically connected to the terminal wiring 150. The terminal wiring 150 is connected to the terminal electrode 124 arranged in the mounting pad 110. As a result, the sensor electrode 122 is electrically connected to the terminal electrode 124.

As shown in FIG. 1, the touch sensor 106 may be configured by a plurality of sensor electrodes 122. In FIG. 1, the sensor electrode 122 is shown as a diamond having diagonal lines in the X and Y directions but is not limited to this shape.

Figure 4:
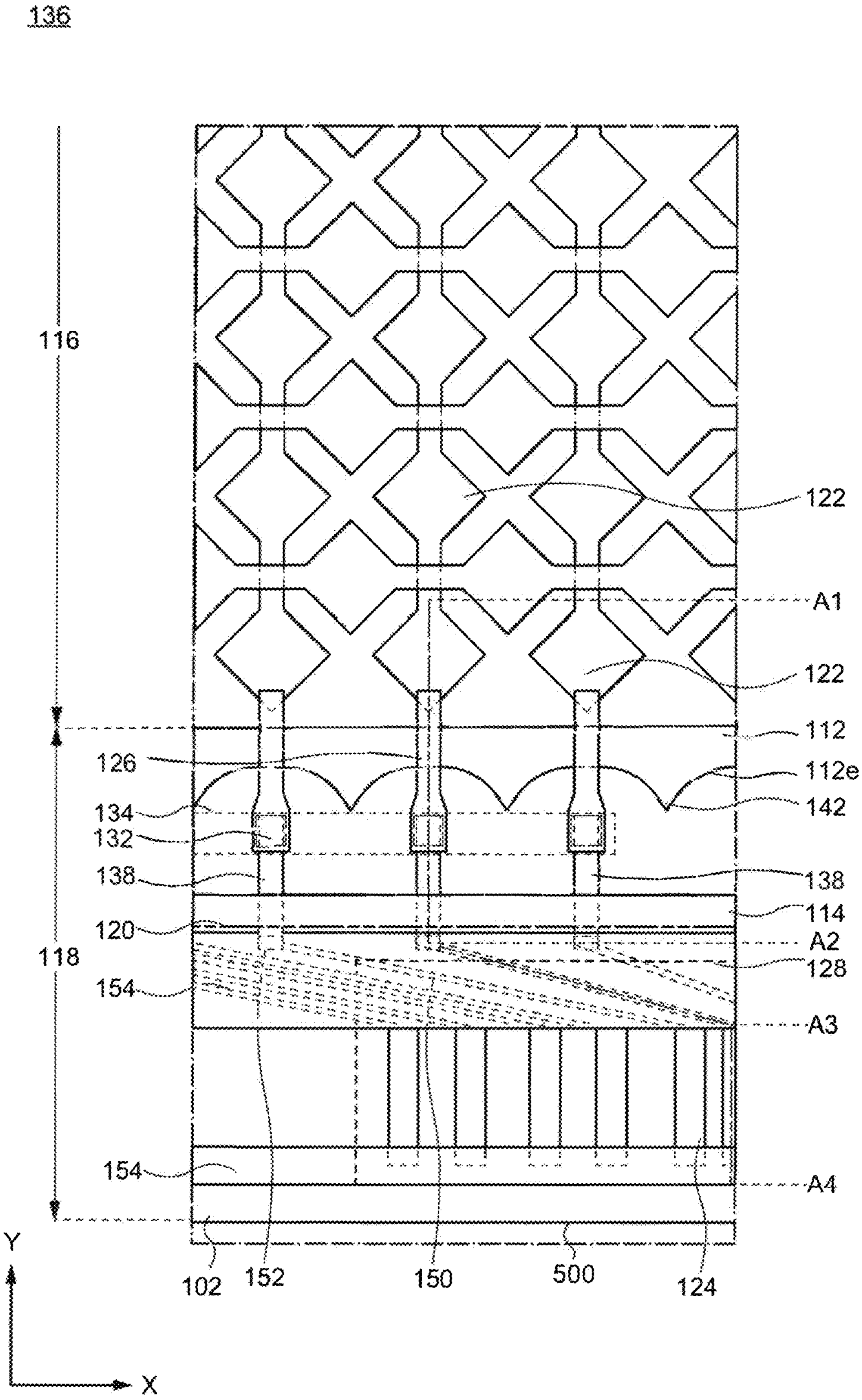
FIG. 4 is a schematic top view of a display device according to an embodiment of the present invention.

A capacitive method, a resistance film method, or the like can be used for the touch sensor 106. In the case where the capacitive method is used for the touch sensor 106, the plurality of sensor electrodes 122 is arranged in a matrix in, for example, the display region 116. The plurality of sensor electrodes 122 may be connected in a row direction (direction X) or a column direction (direction Y), respectively, as shown in FIG. 4. The sensor electrode 122 connected in the row direction and the sensor electrode 122 connected in the column direction are separated from each other. The sensor electrodes 122 connected in the row direction or the column direction may function as electrodes for transmitting or receiving, respectively. In addition, the sensor electrode 122 connected in the row direction or the column direction is electrically connected to the external drive circuit. A signal from the external drive circuit is supplied to one of the sensor electrodes 122 connected in the row direction or the column direction and the other may supply a signal to the external drive circuit.

A driving IC can be used for a drive circuit for driving the sensor electrode 122 similar to the external drive circuit of the pixel 104. The sensor electrode 122 is electrically connected to the driving IC via the mounting pad 110 electrically connected to the sensor wiring 126. The above-described FOG or COF can be used for the mounting pad 110 and the driving IC.

The sensor wiring 126 and the mounting pad 110 are electrically connected by connecting the sensor wiring 126 and the wiring 138. Specifically, as shown in FIG. 1, the sensor wiring 126 and the wiring 138 are directly or electrically connected by the contact 132. Furthermore, the wiring 138 is directly or electrically connected to the mounting pad 110.

As shown in FIG. 1 and FIG. 4, the sensor wiring 126 is arranged from one side of the sensor electrode 122 connected in the row direction or the column direction, respectively. As shown in FIG. 1, the sensor wiring 126 is directly or electrically connected to the wiring 138 at the contact 132, respectively. A plurality of contacts 132 is included in the contact portion 134.

The contact portion 134 is arranged between the first step 112 surrounding the display region 116 and the second step 114 surrounding the first step 112. The contact portion 134 is located between an end portion 500 of the substrate 102 on which the mounting pad 110 is arranged and the first step 112.

The sensor wiring 126 electrically connected to the contact portion 134 extends intersecting the first step 112 between the sensor electrode 122 and the contact portion 134. Furthermore, the wiring 138 electrically connected to the contact portion 134 extends intersecting the second step 114 between the mounting pad 110 and the contact portion 134.

2. Partial Structure 2-1. Partial Structure

FIG. 4 shows a schematic top view of a partial structure 136 of the display device 100 surrounded by dashed lines shown in FIG. 1. Hereinafter, the same configuration as in FIG. 1 may be omitted.

As shown in FIG. 4, the first step 112 has an outer edge **112*e* and a plurality of protrusions 142. The outer edge 112*e* is the outer shape of the first step 112 facing the end portion 500 of the substrate 102. The plurality of protrusions 142 protrudes in the direction of the end portion 500 of the substrate 102 and in the direction of the terminal electrode 124 arranged in the peripheral region 118**.

The sensor wiring 126 is arranged between the plurality of protrusions 142. The sensor wiring 126 is arranged so as to intersect the first step 112. The sensor wiring 126 is directly or electrically connected to the wiring 138 at the contact 132 described above. The wiring 138 is arranged so as to intersect the second step 114.

Further, as shown in FIG. 4, the wiring 138 that intersects the second step 114 can be electrically connected to the terminal electrode 124 mounted on the mounting pad 110 via the terminal wiring 150. In this case, the wiring 138 and the terminal wiring 150 may be directly or electrically connected to each other at the contact 152. The terminal wiring 150 may be covered by an insulating film 154 between the contact 152 and the terminal electrode 124.

Although the sensor wiring 126 is electrically connected to the terminal electrode 124 via a plurality of wirings and contacts as described above, the terminal electrode 124 may extend as a wiring to the contact 132 and may be directly connected to the sensor wiring 126 at the contact 132.

2-2. Cross-Sectional Structure

Figure 5:
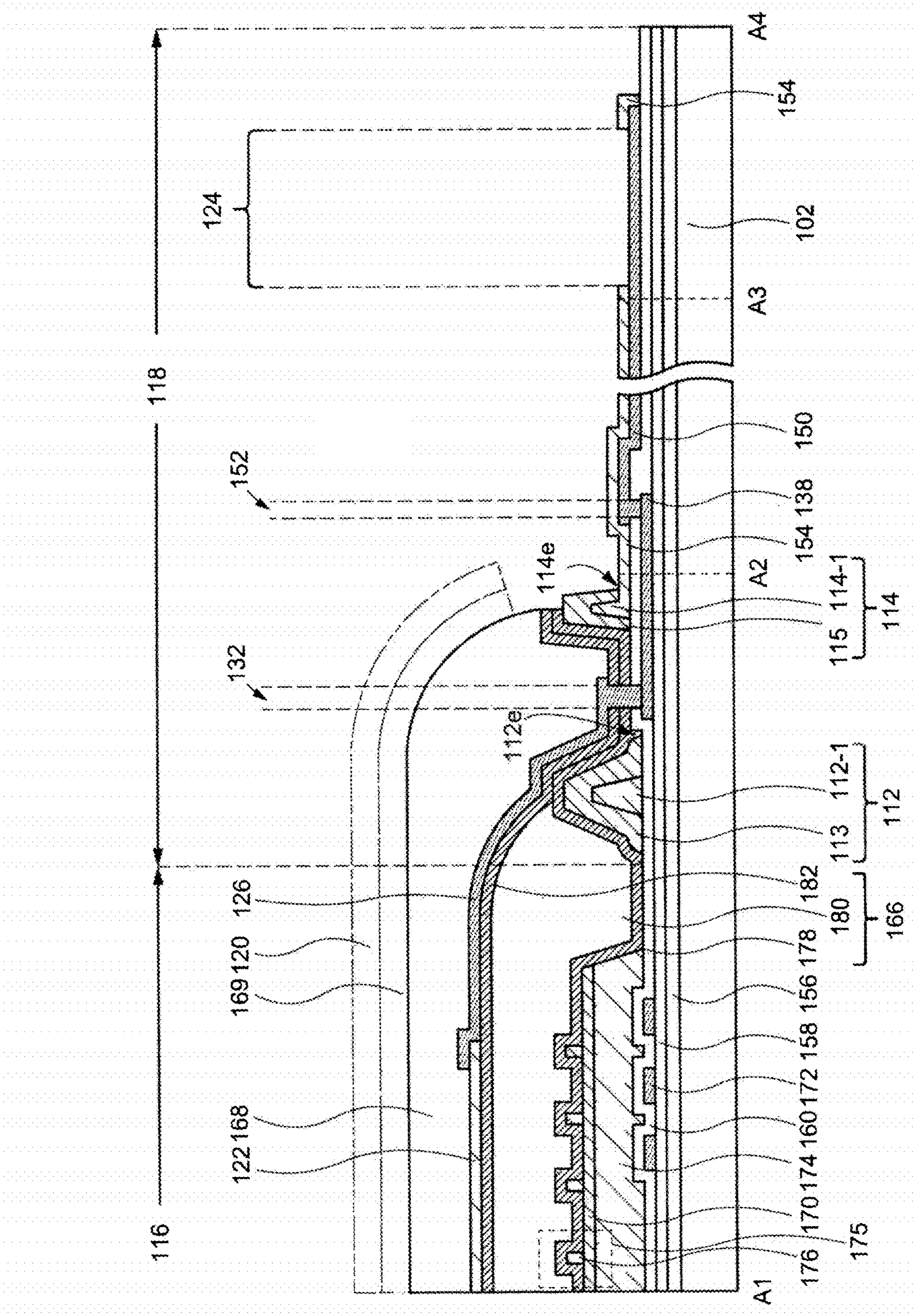
FIG. 5 is a schematic end view of a display device according to an embodiment of the present invention.

FIG. 5 shows a schematic end view along a dashed line A1-A4 shown in FIG. 4. Hereinafter, the same configurations as those in FIG. 1 to FIG. 4 may be omitted.

As described above, the display device 100 includes the substrate 102, and for example, a glass substrate, a quartz substrate, or an organic resin substrate may be used as the substrate 102. In the case where an organic substrate is used, the substrate 102 may have flexibility.

As described above, a base film 156 may be arranged on the substrate 102. The base film 156 can prevent contamination from the substrate 102 and, for example, an inorganic insulating material can be used. For example, silicon nitride, silicon oxide, and composites thereof can be used as the inorganic insulating material.

As described above, an insulating film 158 may be arranged on the base film 156. The insulating film 158 in the display region 116 may have a gate insulating film function of the transistor included in the pixel 104 and the drive circuit 108. A material similar to that of the base film 156 can be used for the insulating film 158.

Above the insulating film 158, a signal line 172 may be arranged in the display region 116, and the wiring 138 may be arranged in a peripheral region. The signal supplied from the drive circuit 108 shown in FIG. 1 to each pixel 104 is transmitted via the signal line 172. Alternatively, the signal line 172 may function as a power line that supplies a constant potential to the pixel 104. As described above, the wiring 138 may function as a wiring that transmits the signal between the external drive circuit and the touch sensor 106 shown in FIG. 1. For example, a material containing titanium, aluminum, copper, molybdenum, or the like as a main component can be used for the signal line 172 and the wiring 138, and the material can be used as a single layer or a stacked layer.

An interlayer film 160 may be arranged on the signal line 172 and the insulating film 158 so as to cover the signal line 172 and the wiring 138. The interlayer film 160 may also function as a planarization film for the signal line 172 or the wiring 138. A material similar to that of the base film 156 can be used for the interlayer film 160.

The terminal wiring 150 that connects with the wiring 138 at the contact 152 may be arranged on the wiring 138 and the interlayer film 160. A material similar to that of the signal line 172 and the wiring 138 may be used for the terminal wiring 150.

A planarization layer 174 may be arranged on the interlayer film 160 and the signal line 172 in the display region 116. Further, the first step 112 and the second step 114 are arranged on the interlayer film 160 in the peripheral region 118. The first step 112 and the second step 114 are arranged between the pixel 104 located in the display region 116 and the terminal electrode 124 located in the peripheral region 118. The first step 112 is arranged between the pixel 104 and the second step 114. For example, as shown in FIG. 5, the first step 112 is arranged between a spacer 176 defining the pixel 104 and the second step 114. The second step 114 is arranged with an overlap with the wiring 138 on the interlayer film 160. The second step 114 is arranged between the first step 112 and the terminal electrode 124.

The first step 112 may be configured with a stacked structure. For example, as shown in FIG. 5, the first step 112 is configured with a stacked structure of a planarization layer 112-1 and an insulating layer 113. The thickness of the first step 112 or the height in a cross-sectional view is the sum of the thicknesses of the planarization layer 112-1 and the insulating layer 113. The planarization layer 112-1 may be formed by removing the planarization layer 174 along the outer periphery of the display region 116. In this case, an end portion of the planarization layer 112-1 facing opposite the display region 116 is referred to as the outer edge 112*e*. In addition, the planarization layer 112-1 formed by removing the planarization layer 174 along the outer periphery of the display region 116 forms a step on the substrate 102. The insulating layer 113 is stacked on the planarization layer 112-1 on which the step is formed, and the first step 112 is formed. As described above, the first step 112 having the sum of the stacked films as the thickness or the height is a structure higher than the other structures on the substrate 102. Therefore, the first step 112 may keep a first organic insulating layer 180 covering the display region 116, which will be described later, inside the display region 116.

The second step 114 may be formed in the same manner as the first step 112. For example, as shown in FIG. 5, the second step 114 may be formed by stacking a planarization layer 114-1 and an insulating layer 115. The planarization layer 114-1 may be formed by the planarization layer 174. In this case, the end portion of the planarization layer 114-1 facing opposite the display region 116 is referred to as an outer edge 114*e*. In addition, the planarization layer 114-1 formed by being removed along the outer periphery of the planarization layer 112-1 forms a step on the substrate 102. The insulating layer 115 is stacked on the planarization layer 114-1 on which the step is formed, and the second step 114 is formed. Forming the second step 114 in this manner makes it possible to keep an overcoat layer 168 in the second step 114. As a result, since the mounting pad 110 is not covered with the overcoat layer 168, the mounting pad 110 can be smoothly connected to a driving IC such as a COF without removing the overcoat layer 168.

Further, the insulating film 154 contiguous with the second step 114 may be arranged on the terminal wiring 150. The insulating film 154 may be formed at the same time or in the same manufacturing process as the second step 114. For example, the insulating film 154 can be formed by arranging the planarization layer 114-1 among the films forming the second step 114 up to the top of the terminal wiring 150, arranging a full-tone mask on the planarization layer 114-1 corresponding to the second step 114, arranging a halftone mask from the outer edge 114*e* of the planarization layer 114-1 to the top of the terminal wiring 150, performing exposure, and developing and firing. The halftone mask is a photomask having a non-uniform light transmittance and a low light transmittance compared with the full-tone mask.

In this case, the terminal wiring 150 arranged under the insulating layer 154 includes a portion that is exposed from the insulating film 154 in the COF mounting region 128, which can be used as the terminal electrode 124 of the mounting pad 110.

A material similar to that of the signal line 172 or the wiring 138 can be used as a material used for the terminal electrode 124 and the terminal wiring 150. In addition, photosensitive organic resin materials, including acrylic resin, polysiloxane, polyimide, polyester, and the like can be used as the planarization layer 174, the planarization layer 112-1, the planarization layer 114-1, and the insulating film 154, which can function as organic insulating layers. Further, a photosensitive organic resin material including an epoxy-resin, an acrylic-resin, or the like can be used as the insulating layer 113 and the insulating layer 115.

Further, a spacer 176 and a partition layer 170 may be arranged on the planarization layer 174. The partition layer 170 functions as a partition that defines the pixel 104. In addition, the partition layer 170 is arranged so as to cover an end portion of the light-emitting element electrode arranged in the pixel 104. The spacer 176 may be arranged on the partition layer 170 and may have a function of supporting a fine mask used in a manufacturing process of the light-emitting element of the pixel 104, for example, a vapor deposition process.

Figure 6:
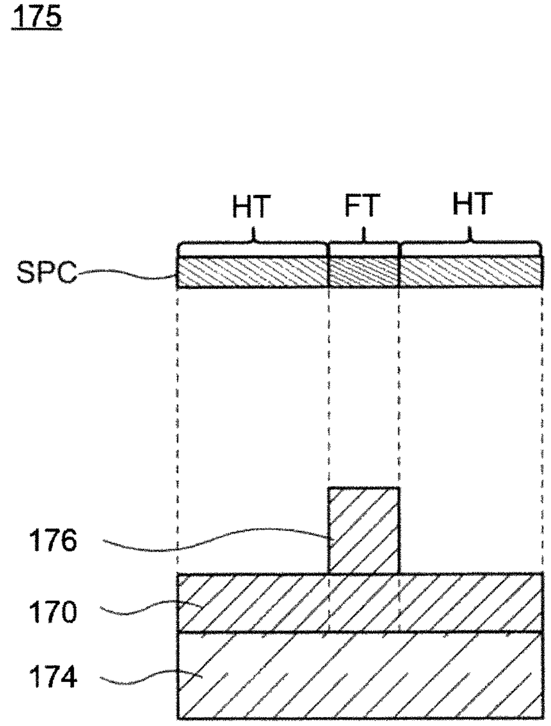
FIG. 6 is a schematic end view of a display device according to an embodiment of the present invention.

The partition layer 170 and the spacer 176 can be formed from the same layer. FIG. 6 shows a schematic end view of a partial structure 175 shown in FIG. 5. For example, the partition layer 170 and the spacer 176 are formed by forming a resin film on the planarization layer 174 and exposing the resin film using an SPC mask including a full-tone mask FT and a halftone mask HT, as shown in FIG. 6. Specifically, a pattern corresponding to the spacer 176 is exposed using the full tone mask FT, and a pattern corresponding to the partition layer 170 is exposed using the halftone mask HT, and developed and fired, whereby the spacer 176 having a large thickness and the partition layer 170 having a small thickness can be formed from the same layer. An organic resin material such as an epoxy resin or an acrylic resin used for the insulating layer 113 or the insulating layer 115 can be used as the spacer 176 and the partition layer 170.

A sealing layer 166 is arranged on the spacer 176 and in a region surrounded by the first step 112 and the second step 114 in a plan view. The sealing layer 166 includes a plurality of insulating layers, each of which may be arranged with different functions. For example, as shown in FIG. 5, the sealing layer 166 includes a first inorganic insulating layer 178, the first organic insulating layer 180, and a second inorganic insulating layer 182.

A region surrounded by the first step 112 and the second step 114 includes the display region 116, and in the case where an organic EL element is used for the pixel 104, the first inorganic insulating layer 178 covers the region, thereby suppressing entry of impurities into the organic EL element. For example, an inorganic compound such as silicon oxide or silicon nitride can be used as the first inorganic insulating layer 178.

The first organic insulating layer 180 is arranged in a region above the first inorganic insulating layer 178 and surrounded by the first step 112 in a plan view. The first organic insulating layer 180 is arranged along the outer edge 112*e* so as not to exceed the planarization layer 112-1 or the first step 112. In addition, the first organic insulating layer 180 can planarize the surface of the pixel 104 and in the case where the light-emitting element is arranged in the pixel 104, the light-emitting element can be protected from contaminants. The same material as that of the insulating film 154 can be used for the first organic insulating layer 180.

The second inorganic insulating layer 182 may be arranged on the first organic insulating layer 180 and in a region surrounded by the first step 112 and the second step 114 in a plan view. The second inorganic insulating layer 182 contacts the first inorganic insulating layer 178 at a region outside the organic insulating layer. As a result, the first inorganic insulating layer 178 and the second inorganic insulating layer 182 cover the first step 112 and extend outside the first step 112. With such a configuration, the first inorganic insulating layer 178 and the second inorganic insulating layer 182 can seal the first organic insulating layer 180. For example, an inorganic compound such as silicon nitride can be used as the second inorganic insulating layer 182.

A plurality of different types of films, such as the first organic insulating layer 180 and the second inorganic insulating layer 182 described above, can be planarized on the pixel 104 and protected from light-emitting element contaminants arranged on the pixel 104, so that in the display region 116, a structure, such as the touch sensor 106, can be arranged on the pixel 104.

The sensor electrode 122 may be arranged on the second inorganic insulating layer 182 in the display region 116. Since the sensor electrode 122 is arranged in the display region 116, a transparent conductive film of light transmittance oxide that can ensure visibility of a displayed image, such as indium-tin oxide (ITO), indium-zinc oxide (IZO), zinc oxide (ZnO), or indium-tin-zinc oxide (ITZO), having conductivity, can be used, for example.

In addition, the sensor wiring 126 that connects with the sensor electrode 122 and the wiring 138 is arranged on the sealing layer 166. Specifically, the sensor wiring 126 is arranged on the second inorganic insulating layer 182 of the sealing layer 166. Since the second inorganic insulating layer 182 is also arranged on the first step 112, the sensor wiring 126 is also arranged on the first step 112. A material similar to that of the signal line 172 and the wiring 138 can be used for the sensor wiring 126.

Further, the overcoat layer 168 is arranged so as to cover the sensor electrode 122 and the sensor wiring 126. In a plan view, the overcoat layer 168 is arranged in a region surrounded by the second step 114. The same material as that of the first organic insulating layer 180 can be used for the overcoat layer 168.

The counter substrate 120 may be arranged on the overcoat layer 168. In FIG. 5, although an example in which the counter substrate 120 is arranged so as to overlap the overcoat layer 168 is shown, the counter substrate 120 may be arranged on a structure arranged on the substrate 102. Films, glass, or the like having a polarization plate function can be used as the counter substrate 120. In addition, the counter substrate 120 has a function of protecting the structure arranged on the substrate 102, for example, the pixel 104, the touch sensor 106, and the like. Further, in the case where the counter substrate 120 and the substrate 102 are bonded together, an adhesive layer 169 can be used between the counter substrate 120 and the substrate 102. An adhesive may be used as the adhesive layer 169. The adhesive may be an adhesive having a refractive index close to that of the counter substrate 120 such as an OCA (Optical Clear Adhesive).

Applying such an adhesive to the surface facing the structure on the substrate 102 makes it possible to bond the counter substrate 120 and the substrate 102 using the adhesive layer 169.

2-3. Partial Structure-1

Figure 7:
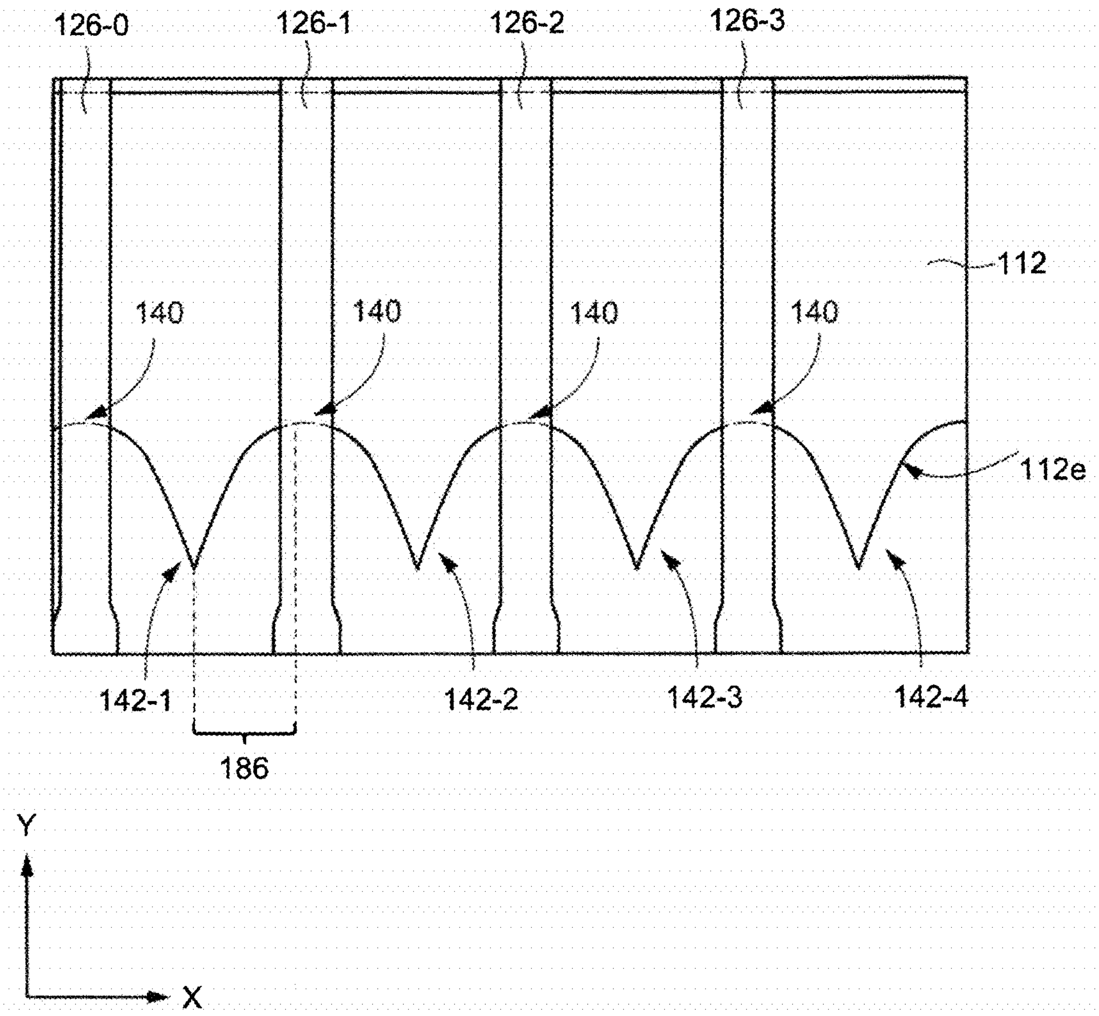
FIG. 7 is a schematic top view of a display device according to an embodiment of the present invention.

FIG. 7 shows an enlarged schematic top view of a plurality of sensor wirings 126 and the first step 112 shown in FIG. 1 and FIG. 4. Hereinafter, the same configurations as those in FIG. 1 to FIG. 6 may be omitted.

At least one of the planarization layer 112-1 and the insulating layer 113 in the first step 112 has the plurality of protrusions 142 protruding toward the terminal electrode 124 in a plan view, and has an intermediate region 140 therebetween. For example, as shown in FIG. 7, at least one of the planarization layers 112-1 and the insulating layer 113 of the first step 112 has the intermediate region 140 located between adjacent protrusions 142-1 and 142-2.

The outer edge 112*e* of the planarization layer 112-1 or the insulating layer 113 in the first step 112 has a curved shape 186 in a plan view from the protrusion 142-1 to the intermediate region 140. In addition, the sensor wiring 126 that intersects with the first step 112 intersects at the intermediate region 140 and extends toward the terminal electrode 124.

The plurality of sensor wirings 126 crosses over the first step 112 and is arranged between the plurality of protrusions 142, respectively. As shown in FIG. 7, a sensor wiring 126-1 is arranged between the protrusion 142-1 and the protrusion 142-2. A sensor wiring 126-2 is arranged between the protrusion 142-2 and a protrusion 142-3. A sensor wiring 126-3 is arranged between the protrusion 142-3 and a protrusion 142-4. With such an arrangement, it is possible to prevent the sensor wiring 126 from being short-circuited by the film remaining on the outer edge 112*e* when the sensor wiring 126 is formed.

2-4. Partial Structure-2

Figure 8A:
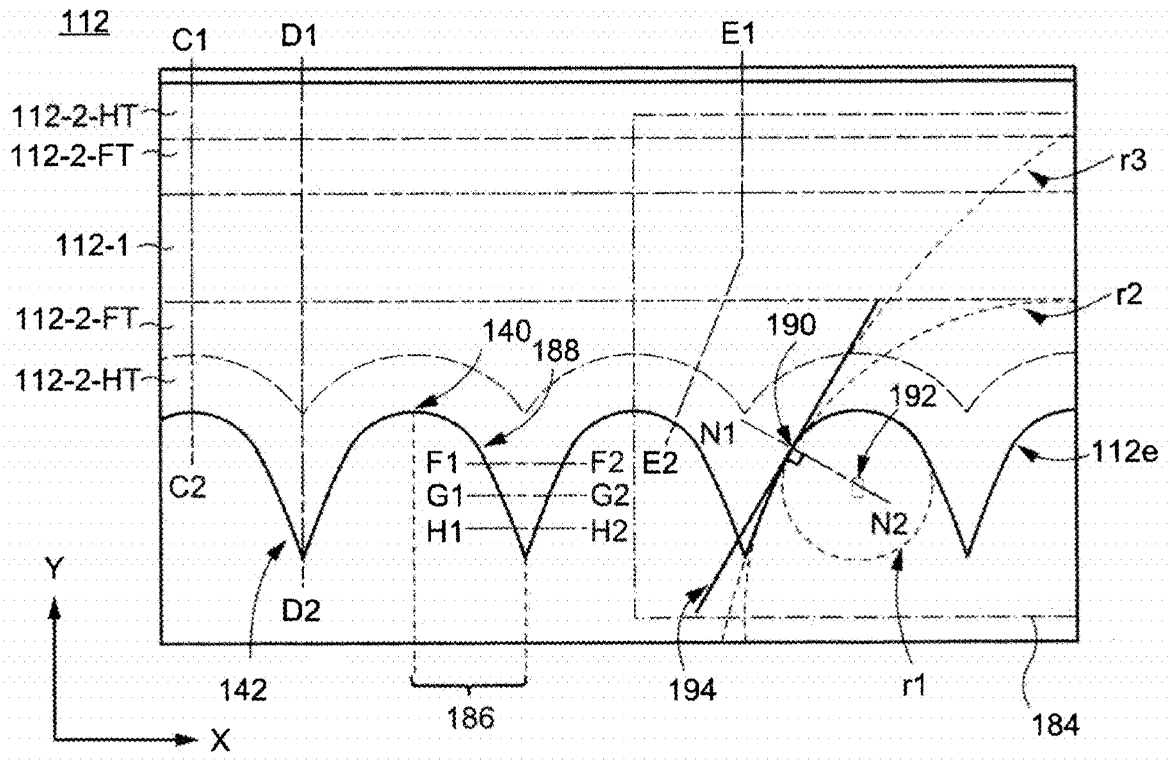
FIG. 8A is a schematic top view of a display device according to an embodiment of the present invention.
Figure 8B:
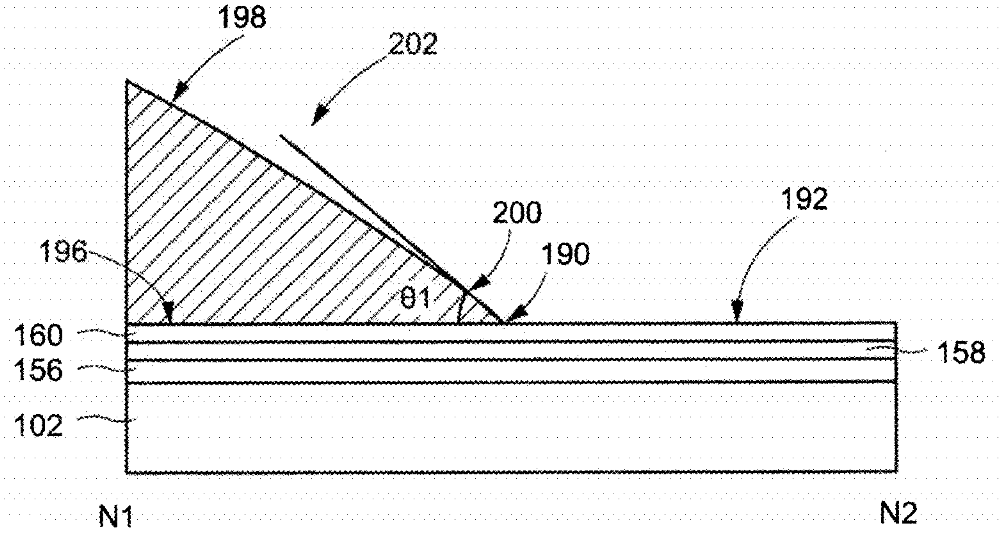
FIG. 8B is a schematic end view of a display device according to an embodiment of the present invention.
Figure 8C:
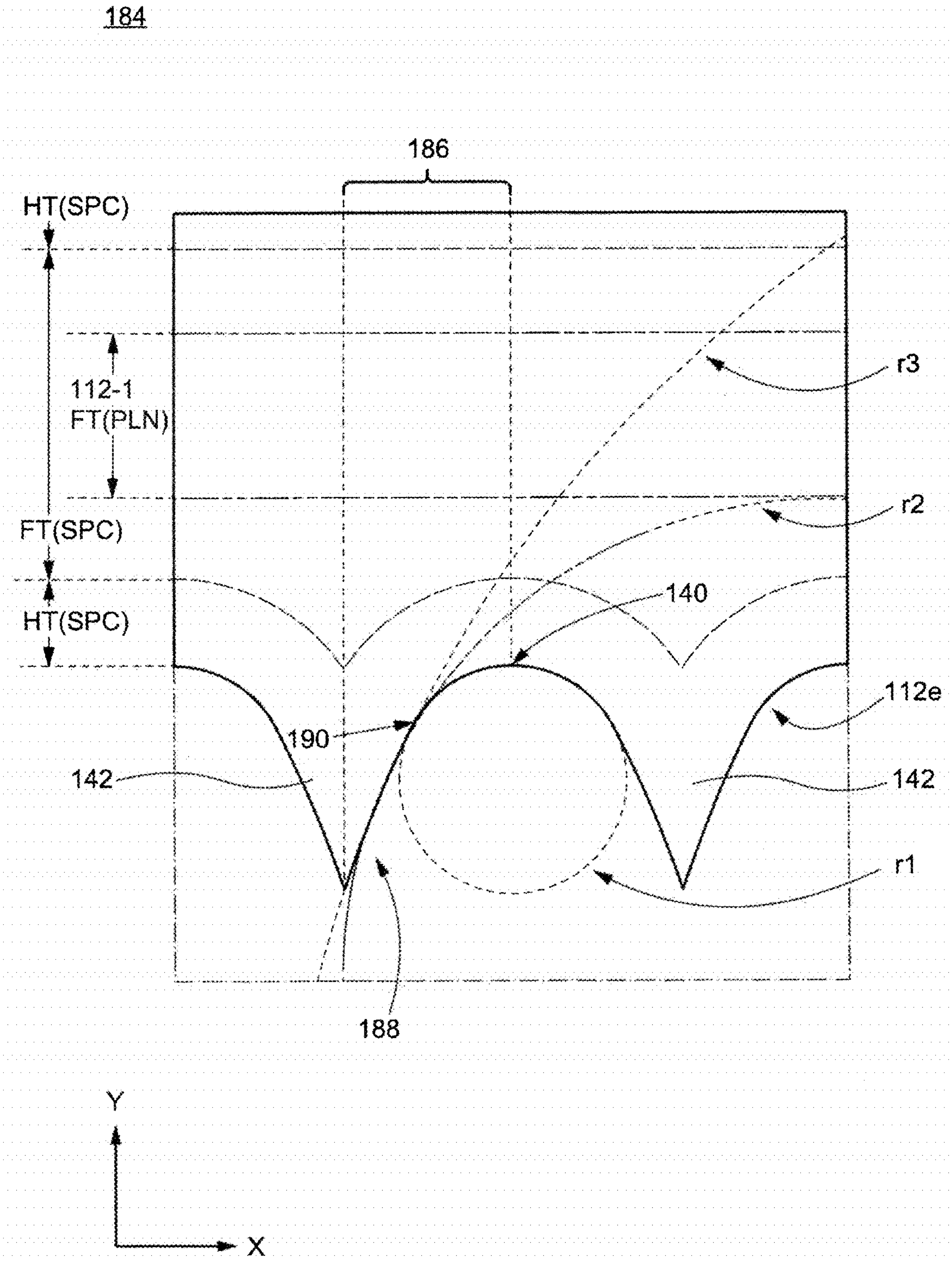
FIG. 8C is a schematic top view of a display device according to an embodiment of the present invention.
Figure 8D:
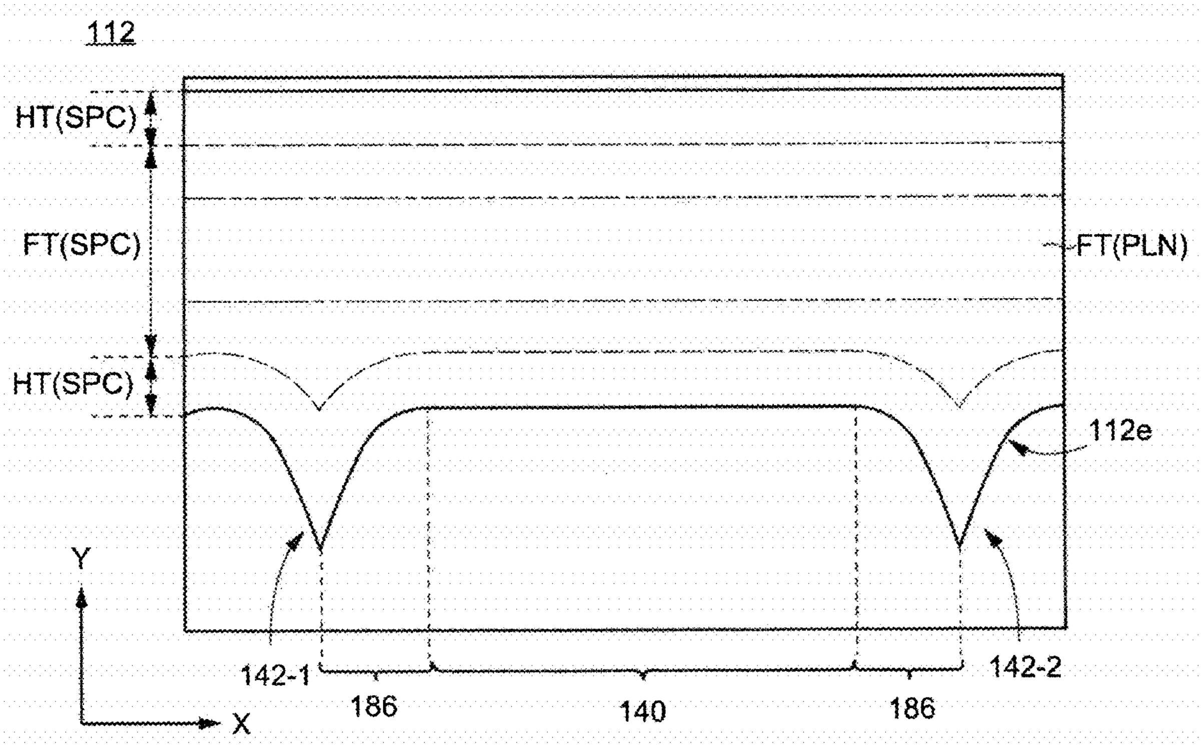
FIG. 8D is a schematic top view of a display device according to an embodiment of the present invention.
Figure 8E:
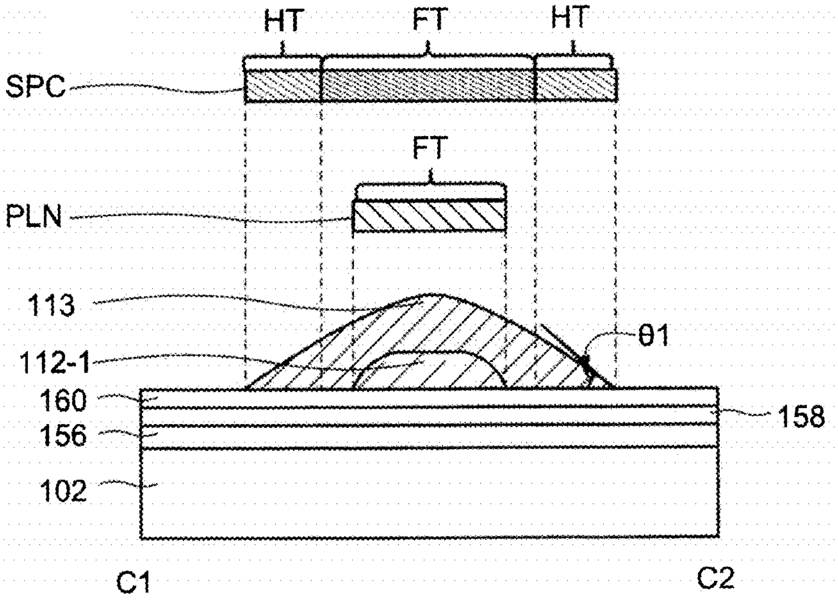
FIG. 8E is a schematic end view of a display device according to an embodiment of the present invention.

The first step 112 having a plurality of protrusions 142 will be described with reference to FIG. 8A to FIG. 8E. FIG. 8A and FIG. 8D show enlarged schematic top views of the first step 112. FIG. 8B shows a schematic end view along a dashed line N1-N2 shown in FIG. 8A. FIG. 8C shows a schematic top view of the partial structure 184 of the display device 100 surrounded by dashed lines shown in the diagram 8A. FIG. 8E shows a schematic end view along a straight line C1-C2 shown in FIG. 8A. Hereinafter, the same configurations as those in FIG. 1 to FIG. 7 may be omitted.

The outer edge 112*e* has the curved shape 186 that curves from the protrusion 142 to the intermediate region 140, as described above. The curved shape 186 is formed by a first curve line 188. As shown in FIG. 8A, the first curve line 188 is included in the outer edge 112*e* in a plan view. The first curve line 188 may be represented as part of a circle. For example, as shown in FIG. 8A and FIG. 8C, the first curve line 188 can be represented by part of a circle r1 to a circle r3. The radius of the smallest circle r1 among the three circles is, for example, 12 μm, and the radius of the circle r2 is 80 μm. The radius of the largest circle r3 can be shown as 220 μm. In this case, a preferable radius of a circle that can be represented as part of the first curve line 188 is 12 μm or more and 800 μm or less, a preferable radius range is 18 μm or more and 420 μm or less, and a more preferable radius range is 40 μm or more and 220 μm or less. In other words, a preferable range of radius of curvature of the first curve line 188 is 12 μm or more and 800 μm or less, a preferable range of radius of curvature is 18 μm or more and 420 μm or less, and a more preferable range of radius of curvature is 40 μm or more and 220 μm or less.

In addition, an interval between the protrusions 142 can be increased or decreased according to the width and intervals of the sensor wiring 126. For example, as shown in FIG. 8D, an interval between the adjacent protrusions 142 may be increased, and the intermediate region 140 located between the curved shapes 186 may be increased. In this case, the shape of the outer edge 112*e* in the intermediate region 140 may be a linear shape. However, the structure in the intermediate region 140 is a structure shown in an end view (refer to FIG. 9A) along C1-C2 described later.

The first step 112 at a first point 190 on the first curve line 188 has a surface 198 inclined with respect to a first surface 196 facing the substrate 102 in a cross-sectional view. The inclined surface 198 and the first surface 196 intersect at the first point 190 in a cross-sectional view. In a cross-sectional view, an angle θ1 formed between the inclined surface 198 and the first surface 196 is 10° or more and 60° or less. More preferably, the angle θ1 formed between the inclined surface 198 and the first surface 196 is 10° or more and 45° or less in a cross-sectional view. In this case, the angle θ1 is defined by the steepest angle of the inclined surface 198.

Specifically, the angle θ1 will be described with reference to FIG. 8A and FIG. 8B. For example, the dashed line of N1-N2 shown in FIG. 8A passes through a center 192 of the circle r1 and the first point 190 on a tangent 194 of the circle r1 and the first curve line 188. As shown in FIG. 8B, the angle θ1 is defined as the largest angle among the angles formed by a straight line 202 connecting a point 200 on the inclined surface 198 and the first point 190 and the first surface 196 in a cross-sectional view.

A process for manufacturing the first step 112 will be described with reference to FIG. 8A and FIG. 8E. First, the planarization layer 112-1 is formed in the same layer as the planarization layer 174 as described above. In this case, the planarization layer 112-1 is formed by full-tone exposure, development, and baking using a mask PLN including the full tone mask in the same manner as the planarization layer 174.

Next, the insulating layer 113 may be formed in the same layer as the spacer 176 and the partition layer 170 formed on the planarization layer 174. A resin film is formed on the interlayer film 160 and the planarization layer 112-1, and the mask SPC is arranged as shown in FIG. 8E and exposure is performed. In the mask SPC, a portion exposed with the halftone HT and a portion exposed with the full tone FT have different exposure amounts, and therefore, a portion exposed with the halftone HT forms a film having a gentle slope in a cross-sectional view as compared with the portion exposed with the full tone FT. In this case, although the same mask SPC as the spacer 176 and the partition layer 170 can be used, the light transmittance of the halftone FT used for the insulating layer 113 may be different from the light transmittance of the halftone HT used for the partition layer 170. Specifically, in the case where the angle 81 of the first step is gentler than the angle of the partition layer 170 in a cross-sectional view, the angle 81 of the first step can be controlled by decreasing the light transmittance of the halftone HT used for the insulating layer 113.

2-5. Inclined Surface

The inclined surfaces of the first step 112 and the protrusion 142 will be described with reference to FIG. 10B from FIG. 9A to FIG. 9F and FIG. 10A.

Figure 9A:
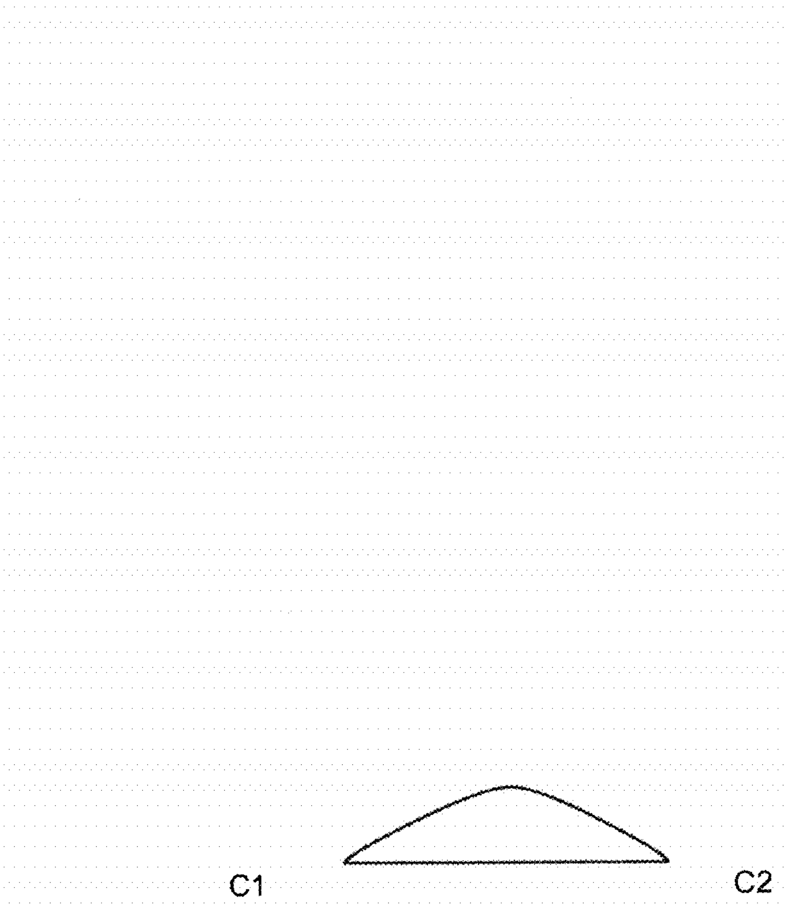
FIG. 9A is a schematic end view of a display device according to an embodiment of the present invention.
Figure 9B:
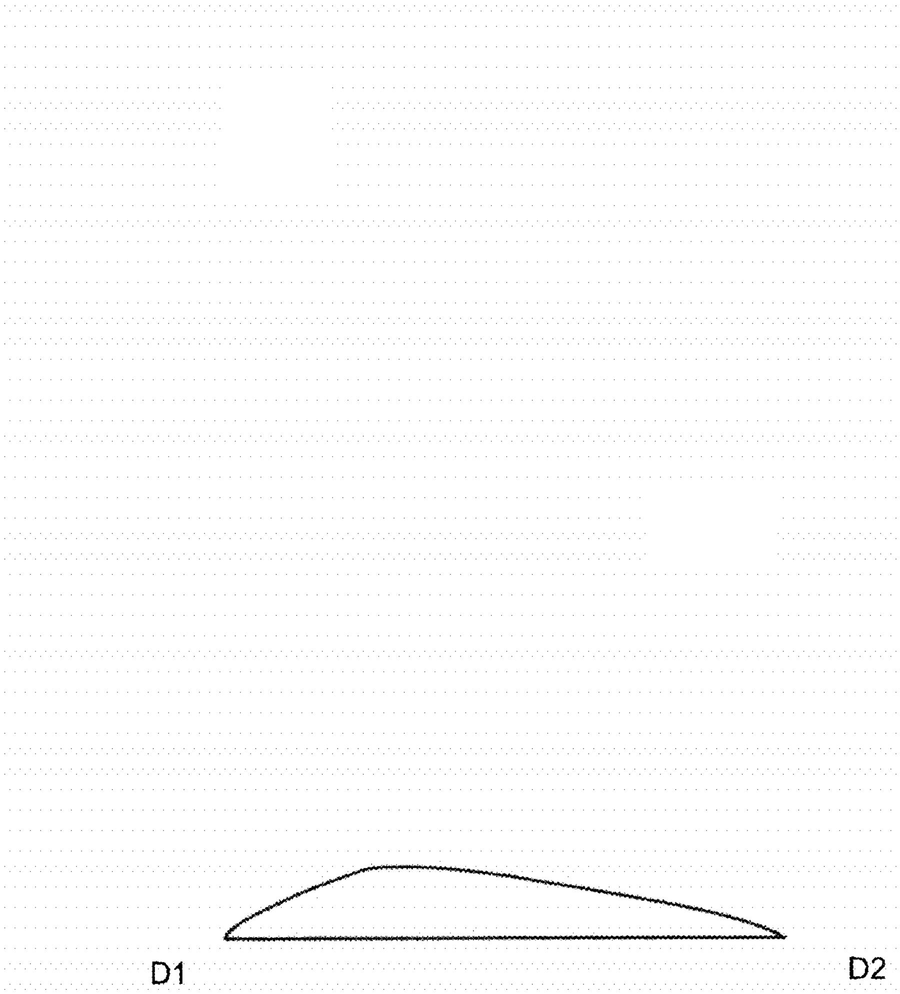
FIG. 9B is a schematic end view of a display device according to an embodiment of the present invention.
Figure 9C:
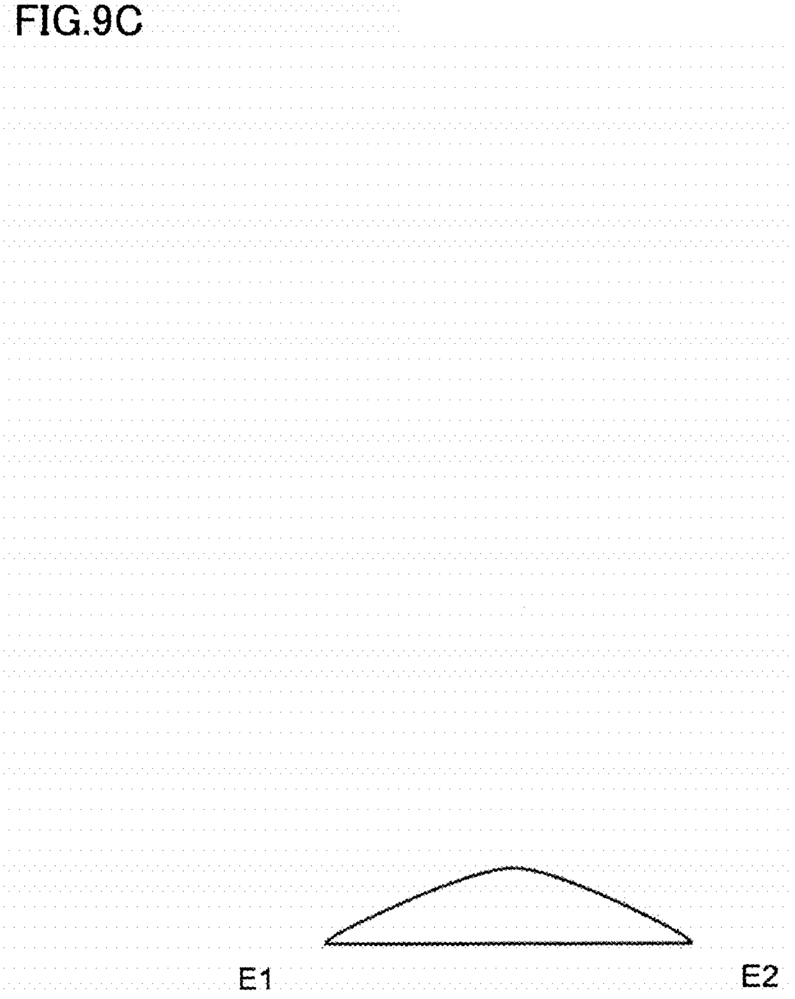
FIG. 9C is a schematic end view of a display device according to an embodiment of the present invention.
Figure 9D:
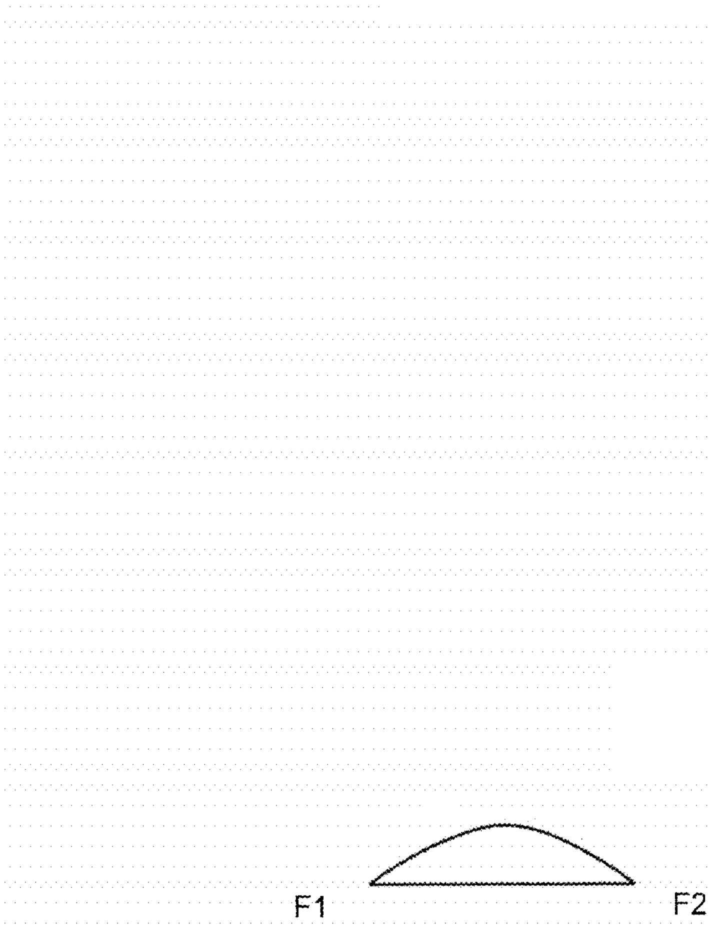
FIG. 9D is a schematic end view of a display device according to an embodiment of the present invention.
Figure 9E:
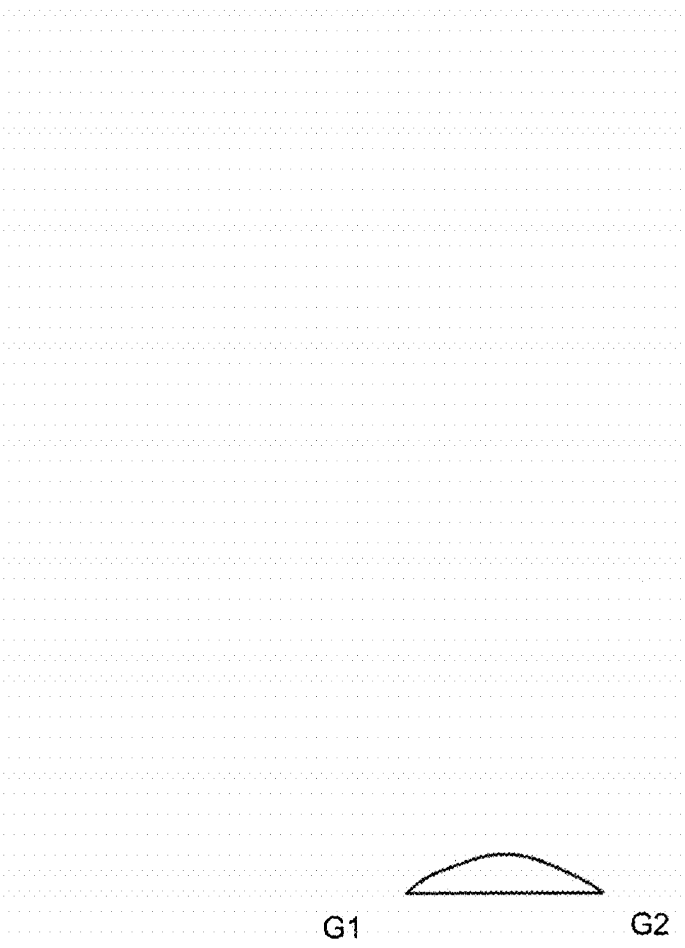
FIG. 9E is a schematic end view of a display device according to an embodiment of the present invention.
Figure 9F:
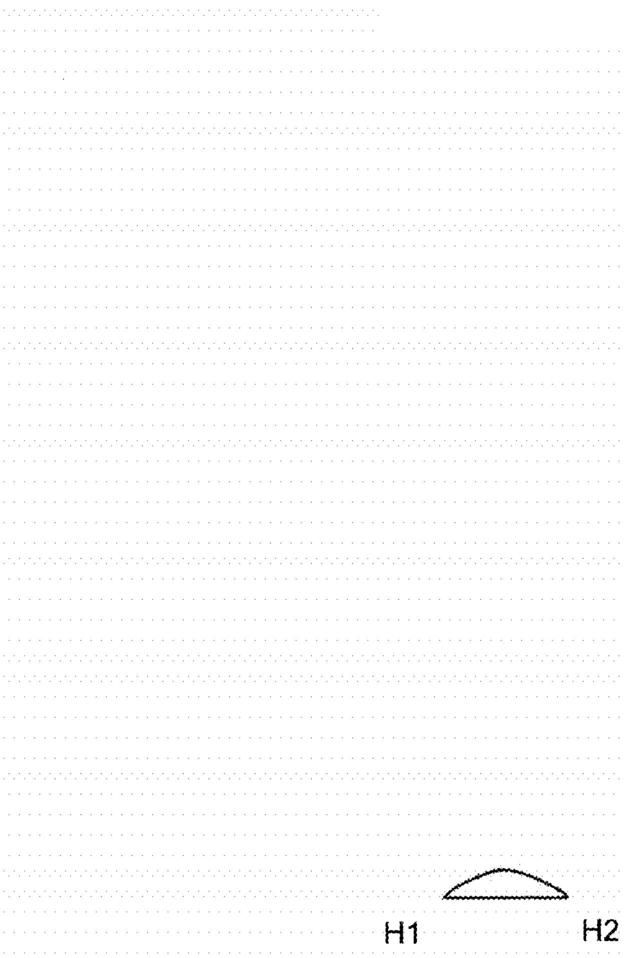
FIG. 9F is a schematic end view of a display device according to an embodiment of the present invention.
Figure 10A:
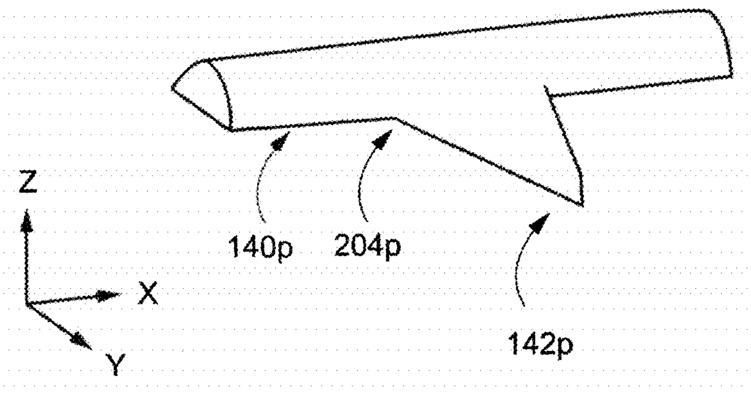
FIG. 10A is a schematic perspective view of a display device according to a comparative example of an embodiment of the present invention.

FIG. 9A to FIG. 9F show enlarged schematic end views of the first step 112 and the protrusion 142. In particular, FIG. 9A shows a schematic end view along C1-C2 shown in FIG. 8A. FIG. 9B shows a schematic end view along D1-D2 shown in FIG. 8A. FIG. 9C shows a schematic end view along E1-E2 shown in FIG. 8A. FIG. 9D shows a schematic end view along F1-F2 shown in FIG. 8A. FIG. 9E shows a schematic end view along G1-G2 shown in FIG. 8A. FIG. 9F shows a schematic end view along H1-H2 shown in FIG. 8A. In this case, the description of the planarization layer 112-1 is omitted in FIG. 9A to FIG. 9F. FIG. 10A shows a schematic perspective view of a conventional protrusion. FIG. 10B shows a schematic perspective view of the protrusion 142. Hereinafter, the same configurations as those in FIG. 1 to FIG. 8 may be omitted.

FIG. 9A is an end view showing a shape of the end surface along the outer edge 112*e* in the intermediate region 140 and the end portion of the first step 112 facing the display region 116. Both end portions of the first step 112 have the angle θ1 shown in FIG. 8B because the angle is controlled by the HT of the mask SPC. A height of the first step 112 is a thickness of the sum of the planarization layer 112-1 and the insulating layer 113. A structure having such a thickness as a height tends to have a steep inclined surface. However, since the first step 112 is formed using the HT of the mask SPC, the inclined surface becomes gentle. As a result, the sealing layer 166 formed over the first step 112 can cover the first step 112 without exposing the first step 112. Specifically, the sealing layer 166 covering the first step 112 is the first inorganic insulating layer 178 and the second inorganic insulating layer 182, and may cover the first step 112 without exposing the first step 112.

Furthermore, the sealing layer 166 may cover not only the outer edge 112*e* of the first step 112 but also the oppositely located inner end portion without exposing the first step 112. Specifically, the first inorganic insulating layer 178 may cover the end portion inside the first step 112.

In addition, in the sealing layer 166 covering the first step 112, the layer in contact with the first step 112 has a gently inclined surface of the first step 112, and therefore, even if it is a layer using an inorganic compound, a layer having uniform film quality can cover the first step 112 without exposing the first step 112.

As described above, the first step 112 is not exposed, the first inorganic insulating layer 178 covers both side surfaces or both end portions of the first step 112 with a uniform film quality, and the second inorganic insulating layer 182 covers the outer edge 112*e* of the first step 112 with a uniform film quality, whereby external moisture can be prevented from penetrating through the second inorganic insulating layer 182 and the first inorganic insulating layer 178 and entering the inside of the panel. As a result, it is possible to suppress adverse effects such as shortening of life due to moisture on the light-emitting element.

FIG. 9B is an end view showing a shape from the end portion of the first step 112 facing the display region 116 along a tip of the protrusion 142. Since the angle of both ends is controlled by the HT of the mask SPC, a gentle slope is shown, but the side surface from the center of the protrusion 142 toward the tip shows a gentler slope toward the tip.

FIG. 9C is an end view showing a shape along the outer edge 112*e* that shows a shape that passes through the center of the first step 112 from the end portion of the first step 112 facing the display region 116 and is curved. Similar to the first step 112 shown in FIG. 9A, the angle of both ends of the first step 112 shown in FIG. 9C is controlled by the HT of the mask SPC, and the outer edge 112*e* is curved, so that it does not become a steep angle 61 but has the angle 61 shown in FIG. 8B.

Figure 10B:
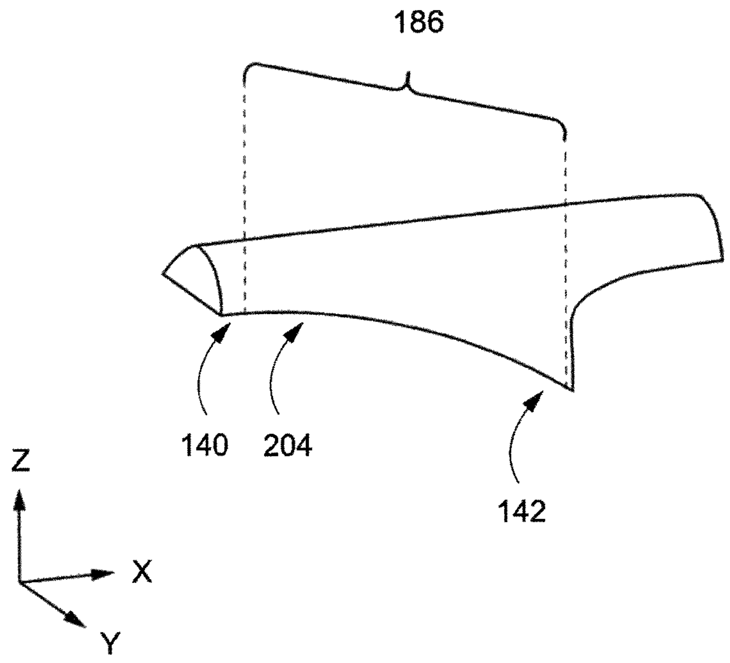
FIG. 10B is a schematic perspective view of a display device according to an embodiment of the present invention.

Referring now to FIG. 10A and FIG. 10B, the outer edge 112*e*, which is a curved shape from the protrusion 142 to the intermediate region 140, is compared with an outer edge 112*ep*, which is not a curved shape from the protrusion 142 to the intermediate region 140. FIG. 10A shows the shape of the outer edge 112*ep* that is not curved from a protrusion 142*p* to an intermediate region 140*p*. FIG. 10B shows the outer edge 112*e* that is shaped to curve from the protrusion 142 to the intermediate region 140. As shown in FIG. 10B, a root portion 204 of the protrusion 142 has the shape 186 in which the protrusion 142 curves toward its tip, and therefore has a gentle shape in a plan view and cross-sectional view. On the other hand, a root portion 204*p* of the protrusion 142*p* shown in FIG. 10A has a steep shape in a plan view and cross-sectional view because the protrusion 142*p* has a straight shape toward its tip.

Therefore, since the outer edge 112*e* has the curved shape from the protrusion 142 to the intermediate region 140, as shown in FIG. 9C, the slope of the outer edge 112*e* is similar to the slope of the first step 112 shown in FIG. 9A.

FIG. 9D to FIG. 9F show end views showing the shapes of both sides of the protrusion 142. As shown in FIG. 9D to FIG. 9F, the width of the protrusion 142 gently narrows toward the tip and the height of the protrusion 142 gently decreases. In addition, the slope of both sides of the protrusion 142 is also reduced.

In the display device 100, the first step 112 is arranged between the pixel 104 and the terminal electrode 124 on the substrate 102, the first step 112 has the plurality of protrusions 142 protruding toward the terminal electrode 124 in a plan view and the intermediate region 140 between the plurality of protrusions 142, and the outer edge of the first step 112 is curved from the protrusion 142 to the intermediate region 140. Therefore, applying the present embodiment makes it possible to maintain the step coverage when the sealing layer 166 covers the first step 112 or when the film is formed on the first step 112, thereby providing a highly reliable display device.

Furthermore, in the display device 100, since the sensor wiring 126 gets over the first step 112 at the protrusion 142 and the protrusion 142 at the intermediate region 140, it is possible to suppress the occurrence of a short circuit between the sensor wirings 126 due to the film remaining when the sensor wirings 126 are formed, thereby providing a display device with high yield and high reliability.

In addition, if the miniaturization of the sensor electrode 122 results in a large number of sensor wirings 126 being used, or when further miniaturization of the sensor wiring 126 is required, then the distance between the protrusions 142 is reduced and the outer shape of the intermediate region 140 is not linear. In such a case, the stress does not concentrate on the sealing layer 166 and the sensor wiring 126 between the protrusions 142 having the curved shape 186 because the border between the interlayer film 160 and the inclined surface 198 beyond the first step 112 is the curved shape 186 and the angle 81 is gentle. Therefore, the sealing layer 166 and the sensor wiring 126 have good film quality and are less likely to crack on the first step 112 and near the border between the interlayer film 160 and the inclined surface 198. Therefore, applying the present embodiment makes it possible to suppress a defect or degradation of the display device 100, thereby providing a display device with high yield and high reliability.

Further, it is understood that, even if the advantageous effect is different from those provided by each of the above-described embodiments, the advantageous effect obvious from the description in the specification or easily predicted by persons ordinarily skilled in the art is apparently derived from the present invention.

What is claimed is:

1. A display device comprising:
a planarization layer on a substrate;
a pixel with an organic electroluminescence element on the planarization layer;
a sealing layer covering the pixel;
a plurality of terminal electrodes arranged along an edge of the substrate, and
a first wiring arranged over the sealing layer and electrically connected to one of the plurality of terminal electrodes,
wherein
the planarization layer has an outer edge that forms a step over the substrate between the pixel and the plurality of terminal electrodes,
the first wiring extends from above the sealing layer to intersect with the step,
in a plan view, the step has
a first protrusion of the planarization layer protruding in a direction of the plurality of terminal electrodes,
a second protrusion adjacent to the first protrusion and protruding in the direction of the plurality of terminal electrodes, and
an intermediate region between the first protrusion and the second protrusion,
the outer edge of the planarization layer has a curved shape in a plan view from the first protrusion to the intermediate region and from the second protrusion to the intermediate region, and
the first wiring intersects the intermediate region and extends in the direction of the plurality of terminal electrodes.

2. The display device according to claim 1,
wherein
the sealing layer has
a first inorganic insulating layer,
a second inorganic insulating layer, and
a first organic insulating layer between the first inorganic insulating layer and the second inorganic insulating layer,
the first organic insulating layer is arranged along the outer edge of the planarization layer so as not to exceed the planarization layer, and
the first inorganic insulating layer and the second inorganic insulating layer are in contact with the first organic insulating layer in an outer region of the first organic insulating layer, covering the step and extending outside the step.

3. The display device according to claim 1, wherein the step has a first surface opposite to the substrate and a second surface inclined with respect to the first surface, the curved shape has a first curved line at the first surface, the first curved line includes a first point, the first surface and the second surface intersect at the first point in a cross-sectional view, and an angle between the first surface and the second surface is 10° or more and 60° or less.

4. The display device according to claim 1, wherein the step has a first surface opposite to the substrate, the curved shape has a first curved line at the first surface, and a curvature radius of the first curved line is 12 μm or more and 220 μm or less.

5. The display device according to claim 1, further comprising:

a second wiring adjacent to the first wiring, wherein in a plan view, the step further includes a third protrusion adjacent to the second protrusion and protruding in the direction of the plurality of terminal electrodes, and the second wiring is arranged between the second protrusion and the third protrusion.

6. A display device comprising:

a substrate, the substrate including an edge extending in a first direction in a plan view;

a first organic insulating layer over the substrate;

a plurality of pixels over the first organic insulating layer;

a sealing layer over the plurality of pixels;

a plurality of terminal electrodes located between the plurality of pixels and the edge of the substrate, and a first wiring over the sealing layer and electrically connected with one of the plurality of terminal electrodes, wherein the first organic insulating layer includes an edge arranged between the plurality of terminal electrodes and the plurality of pixels, in the plan view, the edge of the first organic insulating layer includes a first protrusion protruding toward the edge of the substrate in a second direction crossing the first direction, and a second protrusion protruding toward the edge of the substrate in the second direction, the first protrusion of the first organic insulating layer and the second protrusion of the first organic insulating layer form a continuous curved shape, and the first wiring crosses the edge of the first organic insulating layer between the first protrusion of the first organic insulating layer and the second protrusion of the first organic insulating layer and extends in the second direction.

7. The display device according to claim 6, further comprising:

a sensor electrode over the sealing layer, the sensor electrode being electrically connected with the plurality of terminal electrodes via the first wiring.

8. The display device according to claim 6, wherein the sealing layer includes a first inorganic insulating layer over the plurality of pixels, a second organic insulating layer over the first inorganic insulating layer, the second organic insulating layer including an edge between the plurality of pixels and the edge of the first organic insulating layer, and a second inorganic insulating layer over the second organic layer, the first inorganic insulating layer and the second inorganic insulating layer are in direct contact with each other at a first portion located between the edge of the second organic insulating layer and the plurality of terminal electrodes, and the first wiring, the first portion and the edge of the first organic insulating layer overlap each other in the plan view.

9. The display device according to claim 6, further comprising:

a third inorganic insulating layer between the substrate and the first organic insulating layer, wherein at least a part of the third inorganic insulating layer does not overlap the first organic insulating layer between the edge of the first organic insulating layer and the plurality of terminal electrodes.

10. The display device according to claim 6, wherein a thickness of the first organic insulating layer decreases in the second direction toward the plurality of terminal electrodes at the edge of the first organic insulating layer.

11. The display device according to claim 6, further comprising:

a second wiring over the sealing layer and electrically connected with another one of the plurality of terminal electrodes, wherein the edge of the first organic insulating layer further includes a third protrusion protruding toward the edge of the substrate in the second direction, the second protrusion of the first organic insulating layer and the third protrusion of the first organic insulating layer form a continuous curved shape, and the second wiring crosses the edge of the first organic insulating layer between the second protrusion of the first organic insulating layer and the third protrusion of the first organic insulating layer and extends in the second direction.

12. The display device according to claim 6, wherein a first surface of the first organic insulating layer is in direct contact with a surface of the third inorganic insulating layer, a second surface of the first organic insulating layer and the surface of the third inorganic insulating layer form a taper angle, and the taper angle is 10° or greater and 60° or smaller.

13. The display device according to claim 6, wherein the continuous curved shape includes only a first curved portion, a second curved portion and a third curved portion, the first curved portion is a section of a circle having a first radius, the second curved portion is a section of a circle having a second radius greater than the first radius, and the third curved portion is a section of a circle having a third radius greater than the second radius.

14. A display device comprising:

a substrate, the substrate including an edge extending in a first direction in a plan view;

a first organic insulating layer over the substrate;

a plurality of pixels over the first organic insulating layer;

a sealing layer over the plurality of pixels;

a plurality of terminal electrodes located between the plurality of pixels and the edge of the substrate, and a first wiring over the sealing layer and electrically connected with one of the plurality of terminal electrodes, wherein the first organic insulating layer includes edges arranged between the plurality of terminal electrodes and the plurality of pixels, in the plan view, edges of the first organic insulating layer include a plurality of curved shapes, each of the plurality of curved shapes extends away from the edge of the substrate, and the first wiring crosses the edge of the first organic insulating layer at a portion wherein the plurality of curved shapes are continuous.

15. The display device according to claim 14, further comprising:

a sensor electrode over the sealing layer, the sensor electrode being electrically connected with the one of the plurality of terminal electrodes via the first wiring.

16. The display device according to claim 14, wherein the sealing layer includes a first inorganic insulating layer over the plurality of pixels, a second organic insulating layer over the first inorganic insulating layer, the second organic insulating layer including an edge between the plurality of pixels and the edge of the first organic insulating layer, and a second inorganic insulating layer over the second organic layer, the first inorganic insulating layer and the second inorganic insulating layer are in direct contact with each other at a first portion located between the edge of the second organic insulating layer and the plurality of terminal electrodes, and the first wiring, the first portion and the edge of the first organic insulating layer overlap each other in the plan view.

17. The display device according to claim 14, further comprising:

a third inorganic insulating layer between the substrate and the first organic insulating layer, wherein at least a part of the third inorganic insulating layer does not overlap the first organic insulating layer between the edge of the first organic insulating layer and the plurality of terminal electrodes.

18. The display device according to claim 14, wherein a thickness of the first organic insulating layer decreases in the second direction toward the plurality of terminal electrodes at the edge of the first organic insulating layer.

19. The display device according to claim 14, wherein a first surface of the first organic insulating layer is in direct contact with a surface of the third inorganic insulating layer, a second surface of the first organic insulating layer and the surface of the third inorganic insulating layer form a taper angle, and the taper angle is 10° or greater and 60° or smaller.

20. The display device according to claim 14, wherein the continuous curved portion in the plurality of continuous curved portions includes only a first curved portion, a second curved portion and a third curved portion, the first curved portion is a section of a circle having a first radius, the second curved portion is a section of a circle having a second radius greater than the first radius, and the third curved portion is a section of a circle having a third radius greater than the second radius.

* * * * *